United States Patent [19]

Mori et al.

[11] Patent Number: 4,788,473
[45] Date of Patent: Nov. 29, 1988

[54] PLASMA GENERATING DEVICE WITH STEPPED WAVEGUIDE TRANSITION

[75] Inventors: Haruhisa Mori; Motoo Nakano, both of Yokohama; Yoshinobu Ono, Tokyo; Takashi Igarashi, Yokohama; Masanao Hotta, Akigawa, all of Japan

[73] Assignee: Fujitsu Limited, Kawasaki, Japan

[21] Appl. No.: 63,972

[22] Filed: Jun. 19, 1987

[30] Foreign Application Priority Data

Jun. 20, 1986 [JP] Japan .................... 61-142931
Jul. 30, 1986 [JP] Japan .................... 61-179360

[51] Int. Cl.⁴ .............................................. H01J 3/04
[52] U.S. Cl. .................... 315/39; 315/111.81; 315/111.41; 313/161; 313/359.1; 333/35; 250/423 R
[58] Field of Search ............... 315/39, 111.81, 111.41, 315/111.21; 333/35; 250/423 R; 313/231.31, 363.1, 156, 161, 359.1, 230

[56] References Cited

U.S. PATENT DOCUMENTS

| | | | |
|---|---|---|---|
| 4,041,420 | 8/1977 | Riblet | 333/35 |
| 4,058,748 | 11/1977 | Sakudo et al. | 313/156 |
| 4,173,744 | 11/1979 | Faillow et al. | 315/39.53 X |
| 4,438,368 | 3/1984 | Abe et al. | 315/39 |
| 4,543,465 | 9/1985 | Sakudo et al. | 313/156 |
| 4,598,231 | 7/1986 | Matsuda et al. | 315/111.81 |
| 4,641,060 | 2/1987 | Dandl | 315/39 X |

Primary Examiner—David K. Moore
Assistant Examiner—Mark R. Powell
Attorney, Agent, or Firm—Staas & Halsey

[57] ABSTRACT

A plasma generating device comprises:

a rectangular wave guide for transmitting microwaves, wherein the width of the plasma generating device is decreased in the direction of an electrical field of the microwaves; a plasma generating chamber wherein plasma is generated by absorbing, in a gas, microwave energy transmitted by the rectangular wave guide, and a part of the plasma generating chamber has a rectangular cross-section taken along the plane perpendicular to the microwave propagation direction. A magnetic field generating device is provided having the same axial direction as the direction of propagation of the microwaves and applies a magnetic field having an Electron Cyclotron Resonance intensity to the plasma generating chamber. The magnetic field generating device is provided at least one location outside of the direction of the microwave electrical field direction, and a dielectric window is provided between the rectangular wave guide and the plasma generating chamber to realize a vacuum seal of the plasma generating chamber.

25 Claims, 5 Drawing Sheets

PLASMA GENERATING DEVICE WITH STEPPED WAVEGUIDE TRANSITION

BACKGROUND OF THE INVENTION

1. Field of the Invention

The present invention relates to a plasma generating device, and particularly, it relates to a plasma generating device for ion implantation wherein an ECR source using electron cyclotron resonance is used.

2. Description of the Related Art

FIG. 1 shows a perspective view of a conventional microwave ion source for an ion implanter.

In FIG. 1, a wave guide 1 having a ridge inside is connected to an electrical discharge case 2, and an dielectric window 3 for sealing vacuum is sandwiched between the guide 1 and the case 2. The electrical discharge case 2 comprises two electrical discharge electrodes 4a and 4b separately provided substantially at the center of the case 2 and dielectric spacers 5a and 5b sandwiching the electric discharge electrodes 4a and 4b. The center portion surrounded by the electric discharge electrodes 4a and 4b and the electric spacers 5a and 5b forms a plasma generating chamber. Further, the electric discharge case 2 is surrounded by a coil 6 with which a strong electromagnetic field is applied in the axial direction of FIG. 1.

In above explained plasma generating device, microwaves generated by a microwave generating source (not shown) such as a magnetron are transmitted by the wave guide 1 and led to the electrical discharge case 2 through the dielectric window 3. The microwaves generate a strong microwave electrical field to the plasma generating chamber formed between the dielectrics 4a and 4b, and the magnetic field generated by the coil 6 is applied in the direction perpendicular to the electrical field generated by the microwaves. In order to generate plasma in the plasma generating chamber, a gas is led to the plasma generating chamber through a gas tube (not shown), and a high density plasma is generated in the plasma generating chamber by the interaction of the microwave electrical field and the coil magnetic field. The ions in the plasma are drawn outside in the form of an ion beam 9 by applying a suitable voltage to an ion extraction electrode system 8.

In the conventional device as shown in FIG. 1, the coil 6 surrounds the entire plasma generating device, and thus the magnetic resistance is very large. Therefore, to provide a strong magnetic field at the plasma generating chamber, the cross-section of the coil must be remarkably enlarged, and this increase of the size of the coil causes a corresponding increase in the size of the entire plasma generating device.

Japanese Unexamined Patent Publication (Kokai) No. 60-133646, published on July 16, 1985 discloses a microwave ion source, but this is not related to an ECR source. Also, it is provided with a large magnet, and a dielectric window is exposed to plasma.

SUMMARY OF THE INVENTION

An object of the present invention is to provide a plasma generating device wherein the weight and size of a coil surrounding a plasma generating chamber and that of a plasma generating device are decreased.

It is further object of the present invention to provide an improved plasma generating device using an electron cyclotron resonance (ECR) in particular.

According to the present invention there is provided a plasma generating device comprising:

a rectangular wave guide for transmitting microwaves, a width of said plasma generating device being decreased in the direction of an electrical field of the microwaves; a plasma generating chamber wherein plasma is generated by absorbing, in a gas, microwave energy transmitted by the rectangular wave guide, a part of said plasma generating chamber having a rectangular cross-section taken along a plane perpendicular to the microwave progress direction; a magnetic field generating device having the same axial direction as the direction of propagation of the microwaves and applying a magnetic field having an Electron Cyclotron Resonance intensity to the plasma generating chamber, said magnetic field generating device being provided at least one location outside of the direction of the microwave electrical field; and a dielectric window provided between the rectangular wave guide and the plasma generating chamber to realize a vacuum seal of the plasma generating chamber.

According to the present invention there is further provided a plasma generating device comprising:

a rectangular wave guide for transmitting microwaves, the width of said plasma generating device being decreased in the direction of the electrical field of the microwaves; a plasma generating chamber wherein plasma is generated by absorbing, in a gas, microwave energy transmitted by the rectangular wave guide, a part of said plasma generating chamber having a rectangular cross-section taken along the plane perpendicular to the direction of propagation of the microwaves; a magnetic field generating device having the same axial direction as the direction of propagation of the microwaves and applying a magnetic field having an Electron Cyclotron Resonance intensity to the plasma generating chamber, said magnetic field generating device being provided at least one location outside of the direction of the microwave electrical field, and providing ramified portions extending right the microwave electrical field at the end portion in the direction of propagation of the microwaves, the ramified portions having a length of substantially $\lambda/4$ respectively and the end portions of the ramified portions having short circuit ends; and a dielectric window provided between the rectangular wave guide and the plasma generating chamber to realize a vacuum seal of the plasma generating chamber.

DESCRIPTION OF THE PREFERRED EMBODIMENTS

Figure 1:
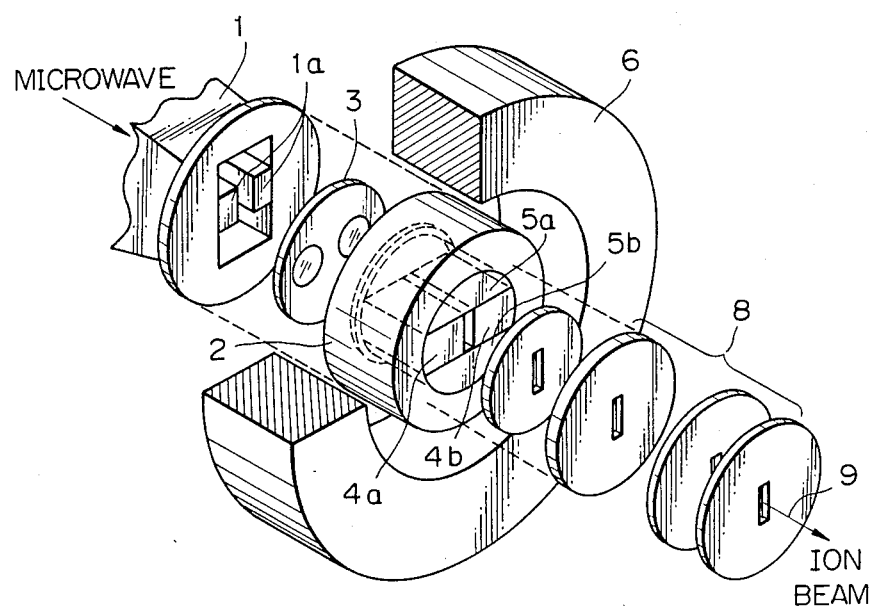
FIG. 1 is a perspective view of a conventional plasma generating device.
Figure 2:
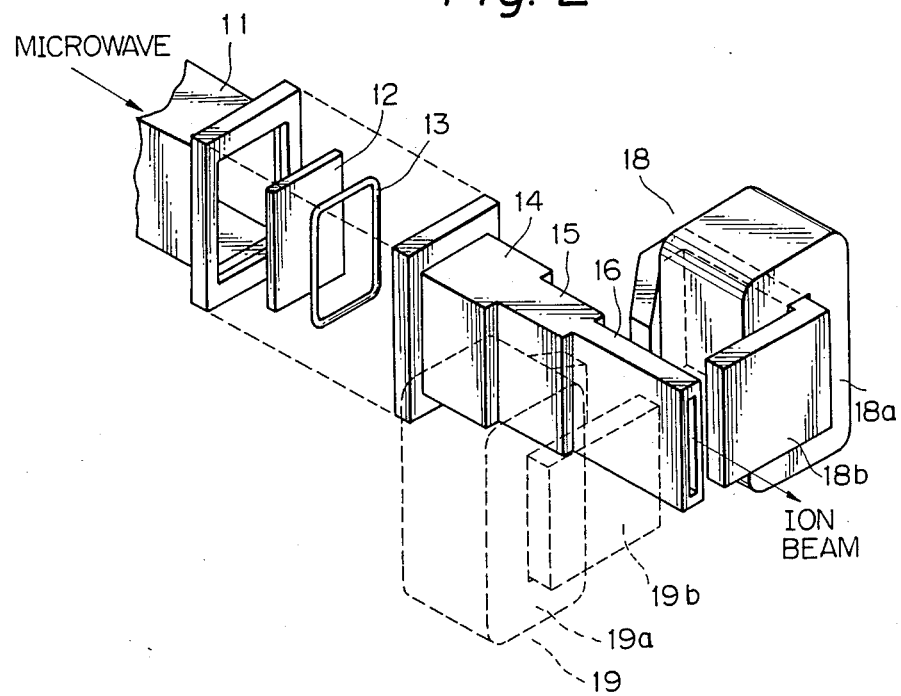
FIG. 2 is a perspective view of an example according to the present invention.
Figure 3:
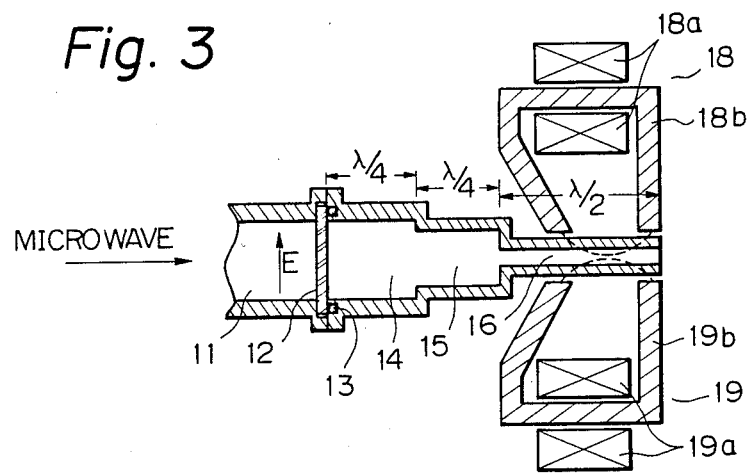
FIG. 3 is a cross-sectional view of FIG. 2.

FIGS. 2 shows an exploded perspective view of an example according to the present invention, and FIG. 3 shows a cross-sectional view of the example of FIG. 2 when assembled.

As shown in FIGS. 2 and 3, a rectangular wave guide 11 is connected to a vacuum seal dielectric window 12 made of silica ($SiO_2$) or alumina ($Al_2O_3$), etc., and to a wave guide 14 through a rubber O-ring 13. The wave guide 14 is connected to a plasma generating chamber 16 through a wave guide 15. The dimension of the wave guide 14 in the direction E (FIG. 3), at a right angle to the direction of propagation of the microwaves, is the same as that of the rectangular wave guide 11, but this dimension is reduced in steps along the length of the wave guide 14, i.e., at the entrance to the wave guide portion 15 and the entrance to the plasma generating chamber 16, as shown in FIG. 3.

For example, the each rectangular wave guide 11 and 14 has the length and breadth ratio of 2:1. The width of the wave guides 14 and 15 and the plasma generating chamber 16 are gradually decreased, for example, 55 mm, 23 mm, and 10 mm respectively.

Further, the lengths in the microwave propagation direction are $\lambda/4$ in the wave guides 14 and 15 and $\lambda/2$ in the plasma generating chamber 16.

At the sides of the plasma generating chamber 16 an electromagnet 18 consisting of a coil 18a and an iron core 18b, and an electromagnet 19 consisting of a coil 19a and an iron core 19b are provided in a symmetrical arrangement. The iron cores 18b and 19b are passed through the respective coils 18a and 19a and are bent at each side so that the ends thereof are close to the sides of the plasma generating chamber 16, thus realizing a considerable decrease in the magnetic resistance. This structure allows the application of a magnetic field (shown by broken lines in FIG. 3) having the same axis as that of the direction of microwave propagation.

The microwave (2.45 GHz) generated from a microwave generating source (not shown) such as a magnetron, etc., are transmitted by a $TE_{10}$ mode through the rectangular wave guide 11 and introduced to the wave guide 14.

The dielectric window 12 prevents the penetration of gas to the plasma generating chamber 16 from the rectangular wave guide 11. The microwaves introduced to the wave guide 14 reach the plasma generating chamber 16, but part of the microwaves is reflected at each entrance of the wave guide 15 and the plasma generating chamber 16.

However, since the length of the wave guide 15 is $\lambda/4$, the reflected waves are overlapped with a phase difference of 180 degrees. Namely, the reflected waves are contraposed, resulting in an increase in the transmission of the microwave. Also, since the length of the wave guide 14 is $\lambda/4$, the reflection at each entrance of the dielectric window 12 and the wave guide 15 is the same as in above explanation Since the width of the plasma generating chamber 16 in the direction (E) of the electric field of the microwaves is decreased, the electric field of the microwaves led thereto becomes very strong. When a gas is introduced to the plasma generating chamber 16 through a gas tube (not shown) an electrical discharge occurs. Accordingly, when the above-mentioned magnetic field is applied to the plasma generating chamber 16 by the electromagnets 18 and 19, an ECR (electric cyclotron resonance) electrical discharge occurs, because of the interaction of the electric field and the magnetic field, so that a strong plasma is obtained. The ions in the plasma are drawn out as an ion beam by applying a suitable voltage to a ion beam extraction electrode system (not shown).

Since, in above example, the dielectric window 12 is provided at a position far from the magnetic field, the dielectric window 12 is not exposed to the plasma and it is not contaminated thereby.

Figure 4:
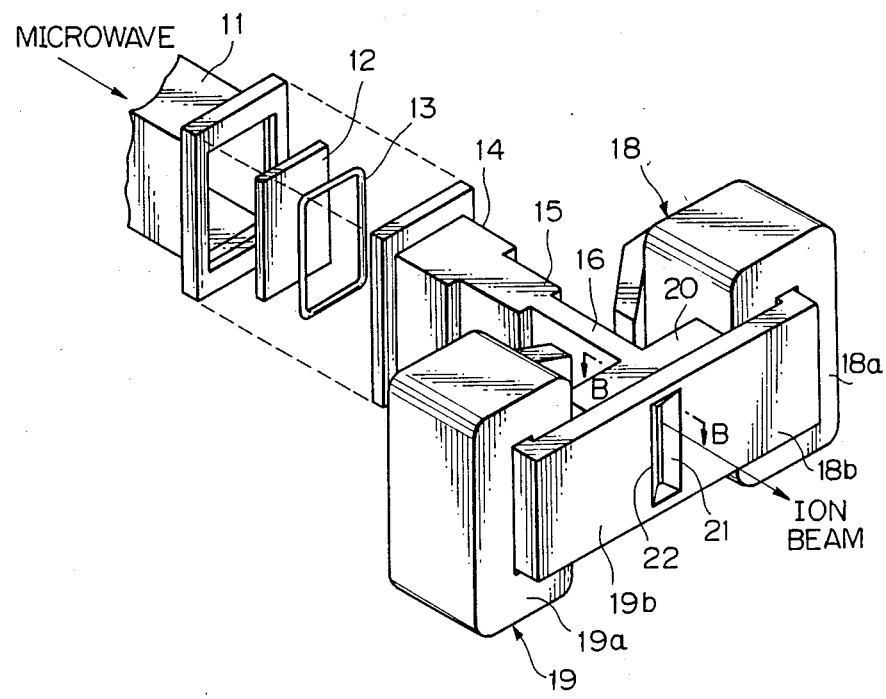
FIG. 4 is a perspective view of another example according to the present invention.
Figure 5:
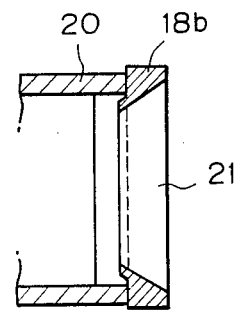
FIG. 5 is a cross-sectional view taken along the line B—B of FIG. 4.
Figure 6:
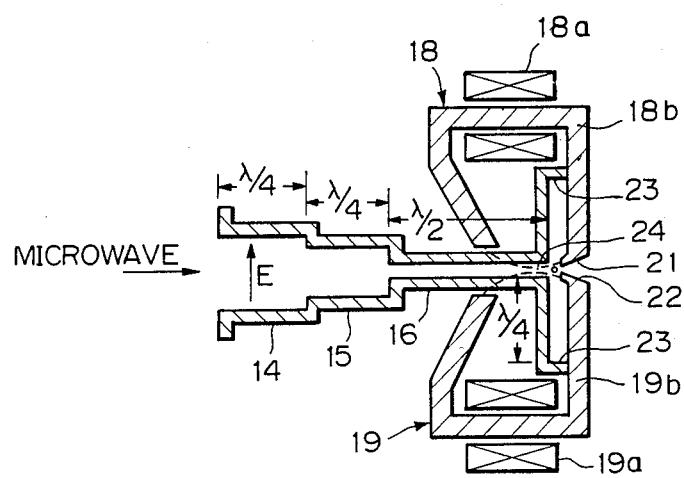
FIG. 6 is a cross-sectional view of FIG. 4.

FIG. 4 shows a perspective view of another example according to the present invention, FIG. 5 shows a cross-sectional view taken along the line B-B of FIG. 4, and FIG. 6 shows a cross-sectional view of the device of FIG. 4 when assembled.

The example of a plasma generating device shown in FIG. 4 is different from the example shown in FIG. 2 in that the plasma generating chamber 16 has an end ramified portion 20 which is provided at the end portion 24 of the plasma generating chamber 16 in such a manner that the end ramified portions 20 are ramified to the right and left in the direction E of the electric field of the microwaves.

The length of the end ramified portions 20 in the direction E of the electric field of the microwaves is $\lambda/4$ and the ends thereof become closed short circuit ends. The end portion 24 of the plasma generating chamber 16, which is open, and the end ramified portions 20 are the main features of the example shown in FIGS. 4 and 6.

At both sides of the plasma generating chamber 16 an electromagnet 18 consisting of a coil 18a and an iron core 18b, and an electromagnet 19 consisting of a coil 19a and an iron core 19b, are symmetrically arranged as explained in the example of FIG. 2. The iron cores 18b and 19b are passed through the respective coils 18a and 19a, and one end of each iron core 18b and 19b is bent to become close to the plasma generating chamber 16. The other ends 21 and 22 are inserted into an open end portion of the end ramified portion 20 and bent so that the ends 21 and 22 are close to the end portion 24 of the plasma generating chamber 16, whereby the magnetic resistance is remarkably decreased.

The microwaves transmitted from the end portion 24 of the plasma generating chamber 16 to both end ramified portions 20 are reflected at the short circuit ends 23. Since in this example of FIG. 4 the length of the microwave in the direction of the electrical field is $\lambda/4$, the voltage amplitude value of the microwave standing wave becomes minimum at the short circuit end 23 and becomes maximum near the end portion 24 of the plasma generating chamber 16 when returned from the short circuit end 23 by $\lambda/4$, as shown in FIG. 8.

When a gas is introduced to the plasma generating chamber 16 through a gas tube (not shown), an electrical discharge occurs, and then, as explained by the example of FIG. 2, ions in a plasma generated by an ECR electrical discharge are drawn out as an ion beam. In this example, the voltage amplitude value of the microwave standing wave becomes maximum near the end portion 24, where the plasma density becomes maximum. Since the ends 21 and 22 of the iron cores 18b and 19b are bent and face the end portion 24 as shown in FIG. 6, a strong magnetic field (shown by broken lines) is easily formed. Since in this example a position where the intensity of the magnetic field is large corresponds to a position where the voltage amplitude value of the microwave standing wave is also large, the plasma is easily obtained.

Figure 8:
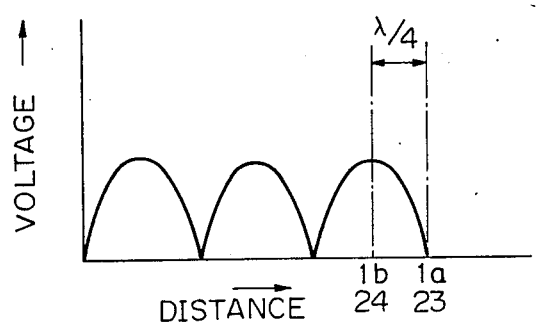
FIG. 8 is a view illustrating a voltage amplitude of a microwave standing wave.
Figure 9:
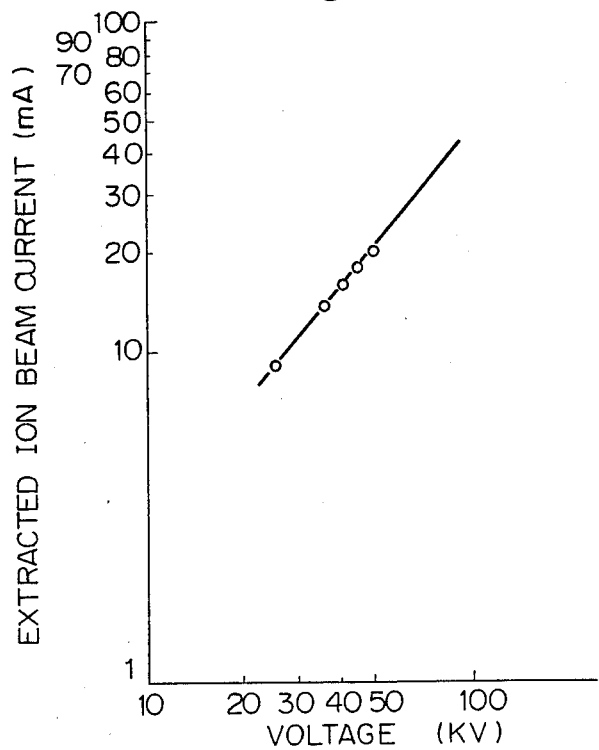
FIG. 9 is a view illustrating voltage-current property according to the present invention.

FIG. 8 shows a relationship between voltage and current according to the present invention.

Figure 7:
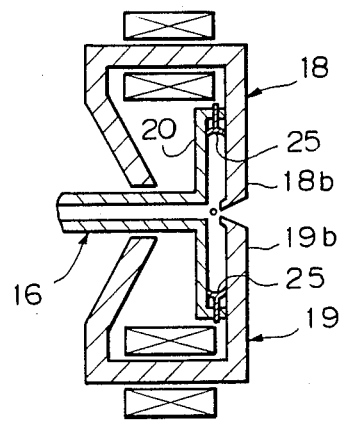
FIG. 7 is a cross-sectional view of another example relating to FIG. 6.

FIG. 7 shows a cross-sectional view of another example relating to FIG. 6.

In FIG. 7, short circuit plates 25 and 26 provided between the end ramified portions 20 and the iron cores 18b and 19b so that the inner length of the ramified portion 20 is changed, whereby the inner length λ/4 thereof is controlled and a position where maximum point of the plasma density is obtained can be set to the most suitable position.

Since the dielectric window 12 is provided far from the magnetic field, the dielectric window 12 is not exposed (as explained in FIG. 2) to the plasma. The magnetic field generating device may be provided at one side of the plasma generating device 16.

Thus, as explained above, it is not necessary for the magnetic field generating device to surround the entire device.

The weight and size of the plasma generating device for an ECR in particular is reduced.

We claim:

1. A plasma generating device comprising:
   a rectangular wave guide for transmitting microwaves, a width of said rectangular wave guide being decreased in a direction of an electrical field of the microwaves;
   a plasma generating chamber, connected to said rectangular wave guide, for generating a plasma by absorbing, in a gas, microwave energy transmitted by said rectangular wave guide, part of said plasma generating chamber having a rectangular cross-section taken along a plane perpendicular to a direction of microwave propagation, and a width of said plasma generating chamber in the direction of the electrical field of the microwaves being narrower than any width of said wave guide;
   first and second magnetic field generating devices having the same axial direction as the direction of microwave propagation and disposed so that said plasma generating chamber is interposed therebetween such that said magnetic field generating devices a magnetic field having an electron cyclotron resonance intensity to the plasma generating chamber; and
   a dielectric window provided in said rectangular wave guide to realize a vacuum seal between said plasma generating chamber and portions of said wave guide.

2. A plasma generating device according to claim 1, wherein said first and said second magnetic field generating devices are arranged symmetrically relative to the plasma generating chamber.

3. A plasma generating device according to claim 2, wherein each of said first and said second magnetic field generating devices consists of an electro-magnet or a permanent magnet.

4. A plasma generatin device according to claim 3, wherein said electromagnet consists of a coil and an iron core being generally U-shaped, extending through the coil, and having ends close to the plasma generating chamber.

5. A plasma generating device according to claim 1, wherein the width of said wave guide decreases as said wave guide approaches said plasma generating chamber in the direction of the electric field of the microwaves.

6. A plasma generating device according to claim 5, wherein the width of the wave guide in the direction of the electric field decreases in steps.

7. A plasma generating device according to claim 1, wherein said rectangular wave guide includes a first wave guide section, connected to said plasma generating chamber having a larger cross-section than said plasma generating chamber, and a second wave guide section, connected to said first wave guide section, having a larger cross-section than said first wave guide section.

8. A plasma generating device according to claim 7, wherein lengths of said first and second wave guide sections in the microwave propagation direction are λ/4 and the length of said plasma generating chamer is λ/2.

9. A plasma generating device according to claim 1, wherein said dielectric window is provided outside said magentic field.

10. A plasma generating device according to claim 1, wherein said dielectric window is made of $SiO_2$ or $Al_2O_3$.

11. A plasma generating device comprising:
    a rectangular wave guide for transmitting microwaves, a width of said plasma generating device being decreased in the direction of an electrical field of the microwaves;
    a plasma generating chamber, connected to said rectangular wave guide, for generating plasma by absorbing, in a gas, microwave energy transmitted by said rectangular wave guide, a part of said plasma generating chamber having a rectangular cross-section taken along a plane perpendicular to a direction of microwave propagation, the end of said plasma generating chamber opposite said rectangular wave guide being ramified, having walls in both the direction of the electrical field of the microwaves and the direction opposite the direction of the electrical field of the microwaves and having short circuit ends extending from the walls in the direction of microwave propagation;
    a magnetic field generating device having the same axial direction as the direction of microwave propagation for applying a magnetic field having an electron cyclotron resonance intensity to the plasma generating chamber, said magnetic field genrating device being provided about said plasma generating chamber, and cooperating with the ramified ends of said plasma generating chamber to form ramified portions extending in the microwave electrical field direction and the opposite direction, the ramified portions having a length of substantially λ/4 respectively; and
    a dielectric window provided in said rectangular wave guide to realize a vacuum seal between said plasma generating chamber and portions of said wave guide.

12. A plasma generating device according to claim 11, wherein said magnetic field generating device consists of a first and a second magnetic field generating sections.

13. A plasma generating device according to claim 12, wherein said first and said second magnetic field generating sections are arranged symmetrically relative to the plasma generating chamber.

14. A plasma generating device according to claim 13, wherein each of said first and second magnetic field generating sections consists of an electromagnet or a permanent magnet.

15. A plasma genrating device according to claim 14, wherein said electromagnet consists of a coil and an iron core, the iron core being generally U-shaped, extending through the coil, and having ends close to the plasma generating chamber.

16. A plasma generating device according to claim 15, wherein a part of said iron core substantially covers the open portion of the ramified portion and extends close to the end portion of the plasma generating chamber in the microwave propagation direction.

17. A plasma generating device according to claim 11, wherein said ramified portion has a length control means therein.

18. A plasma generating device according to claim 11, wherein the end of the ramified portion in the microwave propagation direction is open.

19. A plasma generating device according to claim 1, wherein the width of said wave guide decreases in the direction of said plasma generating chamber in the direction of the eletric field of the microwaves.

20. A plasma generating device according to claim 19, wherein the width of the wave guide in the direction of the electric field decreases in steps.

21. A plasma generating device according to claim 11, wherein said rectangular wave guide includes a first wave guide section, connected to said plasma generating chamber, having a larger cross-section than said plasma generating chamber, and a second wave guide section, connected to said first wave guide section, having a larger cross-section than the first wave guide section.

22. A plasma generating device according to claim 21, wherein lengths of said first and second wave guide sections in the microwave propagation direction are $\lambda/4$ and the length of said plasma generating chamber is $\lambda/2$.

23. A plasma generating device according to claim 11, wherein said dielectric window is provided outside said magnetic field.

24. A plasma generating device according to claim 11 wherein said dielectric window is made of $SiO_2$ or $Al_2O_3$.

25. A plasma generating device according to claim 11, wherein said magnetic field generating device includes an iron core having an aperture at the ramified end of said plasma generating chamber for allowing passage of the plasma and retaining the microwaves.

* * * * *

UNITED STATES PATENT AND TRADEMARK OFFICE
CERTIFICATE OF CORRECTION

PATENT NO. : 4,788,473
DATED : November 29, 1988
INVENTOR(S) : Haruhisa Mori et al.

It is certified that error appears in the above-identified patent and that said Letters Patent is hereby corrected as shown below:

Col. 5, line 45, after "devices" insert --apply--;

Col. 5, line 62, after "core" insert --, the iron core--;

Col. 6, line 19, "magentic" should be --magnetic--;

Col. 7, line 19, "1" should be --11--.

Signed and Sealed this

Eleventh Day of April, 1989

Attest:

DONALD J. QUIGG

Attesting Officer

Commissioner of Patents and Trademarks